United States Patent
Pal et al.

(10) Patent No.: US 12,074,196 B2
(45) Date of Patent: Aug. 27, 2024

(54) GRADIENT DOPING EPITAXY IN SUPERJUNCTION TO IMPROVE BREAKDOWN VOLTAGE

(71) Applicant: Applied Materials, Inc., Santa Clara, CA (US)

(72) Inventors: Ashish Pal, San Ramon, CA (US); Yi Zheng, Sunnyvale, CA (US); El Mehdi Bazizi, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 45 days.

(21) Appl. No.: 17/370,835

(22) Filed: Jul. 8, 2021

(65) Prior Publication Data

US 2023/0008858 A1    Jan. 12, 2023

(51) Int. Cl.
*H01L 29/06* (2006.01)
*H01L 29/66* (2006.01)
*H01L 29/78* (2006.01)

(52) U.S. Cl.
CPC .... *H01L 29/0634* (2013.01); *H01L 29/66712* (2013.01); *H01L 29/7802* (2013.01)

(58) Field of Classification Search
CPC ........... H01L 29/0634; H01L 29/66712; H01L 29/7802; H01L 27/14616; H01L 21/02584; H01L 21/0257
See application file for complete search history.

(56) References Cited

U.S. PATENT DOCUMENTS

| | | | |
|---|---|---|---|
| 8,324,053 B2 | 12/2012 | Bodbe et al. | |
| 8,907,420 B2 | 12/2014 | Saito et al. | |
| 9,070,580 B2 | 6/2015 | Willmeroth et al. | |
| 2004/0238844 A1* | 12/2004 | Tokano | H01L 29/7811 257/E21.345 |
| 2005/0179082 A1* | 8/2005 | Miyata | H01L 29/1095 257/E29.066 |
| 2008/0303114 A1 | 12/2008 | Shibata et al. | |
| 2010/0264470 A1* | 10/2010 | Thirupapuliyur | H01L 29/7848 257/E21.409 |
| 2012/0187527 A1* | 7/2012 | Guitart | H01L 29/0692 257/509 |
| 2014/0191309 A1 | 7/2014 | Eguchi et al. | |

(Continued)

FOREIGN PATENT DOCUMENTS

WO    WO 2014/040507 A1    3/2014

OTHER PUBLICATIONS

PCT International Search Report and Written Opinion for PCT/US2022/036484 dated Nov. 7, 2022.

*Primary Examiner* — Mohammad A Rahman
(74) *Attorney, Agent, or Firm* — Moser Taboa

(57) ABSTRACT

Embodiments of processing a substrate are provided herein. In some embodiments, a method of processing a substrate includes: depositing, via a first epitaxial growth process, an n-doped silicon material onto a substrate to form an n-doped layer while adjusting a ratio of dopant precursor to silicon precursor so that a dopant concentration of the n-doped layer increases from a bottom of the n-doped layer to a top of the n-doped layer; etching the n-doped layer to form a plurality of trenches having sidewalls that are tapered and a plurality of n-doped pillars therebetween; and filling the plurality of trenches with a p-doped material via a second epitaxial growth process to form a plurality of p-doped pillars.

12 Claims, 4 Drawing Sheets

(56) References Cited

U.S. PATENT DOCUMENTS

| | | |
|---|---|---|
| 2016/0087032 A1 | 3/2016 | Hiyoshi |
| 2020/0006475 A1* | 1/2020 | Zhao .................. H01L 21/3065 |
| 2020/0076290 A1 | 3/2020 | Arai et al. |
| 2020/0235201 A1* | 7/2020 | Narita ................ H01L 29/0623 |
| 2020/0312995 A1* | 10/2020 | Nagahisa ............ H01L 29/0696 |
| 2021/0191254 A1* | 6/2021 | Huang ..................... G03F 1/36 |
| 2021/0242338 A1* | 8/2021 | Ankoudinov ......... H01L 29/781 |

* cited by examiner

GRADIENT DOPING EPITAXY IN SUPERJUNCTION TO IMPROVE BREAKDOWN VOLTAGE

FIELD

Embodiments of the present disclosure generally relate to processing of substrates and substrate processing equipment.

BACKGROUND

A metal-oxide-semiconductor field-effect transistor (MOSFET) is a field-effect transistor (FET) with an insulated gate where the voltage determines the conductivity of the device. MOSFETs are commonly used for switching or amplifying signals. The ability to change conductivity with the amount of applied voltage can be used for amplifying or switching electronic signals. MOSFETs having a planar structure have the drawback that if the rated voltage is raised, a drift layer becomes thicker, increasing a resistance between the drain and the source of the MOSFETs during operation (ON-resistance). A super-junction MOSFET has a non-planar structure in which multiple vertical pn junctions are arranged, which can reduce the ON-resistance and reduce the amount of charge that needs to be injected into the gate electrode to turn on the MOSFET while maintaining a high voltage. However, as the size of the multiple vertical pn junctions get smaller, filling the trenches of the vertical pn junction without voids becomes difficult while maintaining a charge balance between the p regions and the n regions of the pn.

Accordingly, the inventors have provided herein improved semiconductor devices and methods of forming improved semiconductor devices.

SUMMARY

Embodiments of processing a substrate are provided herein. In some embodiments, a method of processing a substrate includes: depositing, via a first epitaxial growth process, an n-doped silicon material onto a substrate to form an n-doped layer while adjusting a ratio of dopant precursor to silicon precursor so that a dopant concentration of the n-doped layer increases from a bottom of the n-doped layer to a top of the n-doped layer; etching the n-doped layer to form a plurality of trenches having sidewalls that are tapered and a plurality of n-doped pillars therebetween; and filling the plurality of trenches with a p-doped material via a second epitaxial growth process to form a plurality of p-doped pillars.

In some embodiments, a non-transitory computer readable medium, that when executed via one or more processors, performs a method of processing a substrate including: depositing, via a first epitaxial growth process, an n-doped silicon material onto a substrate to form an n-doped layer while adjusting a ratio of dopant precursor to silicon precursor so that a dopant concentration of the n-doped layer increases from a bottom of the n-doped layer to a top of the n-doped layer; etching the n-doped layer to form a plurality of trenches having sidewalls that are tapered and a plurality of n-doped pillars therebetween; and filling the plurality of trenches with a p-doped material via a second epitaxial growth process to form a plurality of p-doped pillars.

In some embodiments, a semiconductor device includes: an n-doped layer, wherein the n-doped layer has a dopant concentration that increases from a bottom of the n-doped layer to a top of the n-doped layer, and wherein the n-doped layer includes a plurality of trenches having sidewalls that taper inwards to define a plurality of n-doped pillars therebetween; and a plurality of p-doped pillars disposed in corresponding ones of the plurality of trenches.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
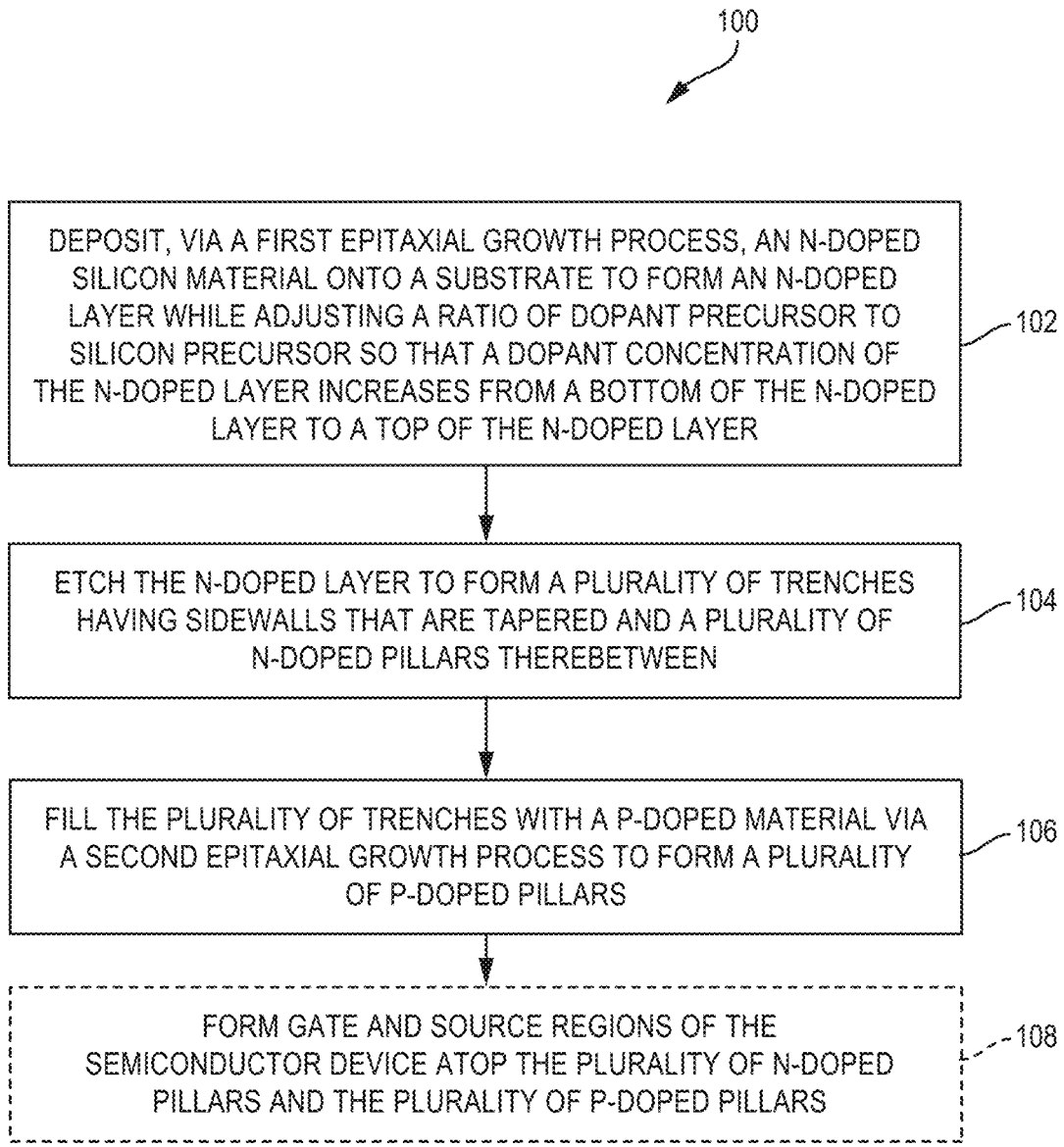
FIG. 1 depicts a flow chart of a method of processing a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of processing a substrate to form field effect transistors (FET) are provided herein. A super-junction metal-oxide-semiconductor field-effect transistor (MOSFET) is a type of (FET) device that has a non-planar structure in which multiple vertical pn junctions are arranged. For example, an n-doped layer may include a plurality of features, such as trenches, to accommodate p-doped material therein to form alternating pn junctions. For example, an n-doped layer may include a plurality of features, such as trenches, to accommodate p-doped material therein to form the pn junctions (e.g., p-channel MOSFET). While the foregoing describes an n-doped layer having a plurality of features to accommodate p-doped material, alternatively, a p-doped layer may include a plurality of features to accommodate n-doped material therein to form the pn junctions (e.g., n-channel MOSFET). However, as the size of the multiple vertical pn junctions get smaller, filling the plurality of trenches of the vertical pn junction without voids becomes difficult.

The inventors have observed that tapered sidewalls of the plurality of trenches advantageously reduce or prevent the formation of voids within the plurality of trenches. However, tapered sidewalls may lead to charge imbalance between the n-doped regions and the p-doped regions, leading to electromagnetic interference and a degradation in breakdown voltage. As such, the inventors have observed that adjusting a dopant concentration of at least one of the n-doped layer or region or the p-doped layer or region of the device advantageously promotes a charge balance between the p regions and the n regions of the pn junction. The methods provided herein may be performed in a multi-chamber processing tool or multiple standalone chambers.

Figure 2A:
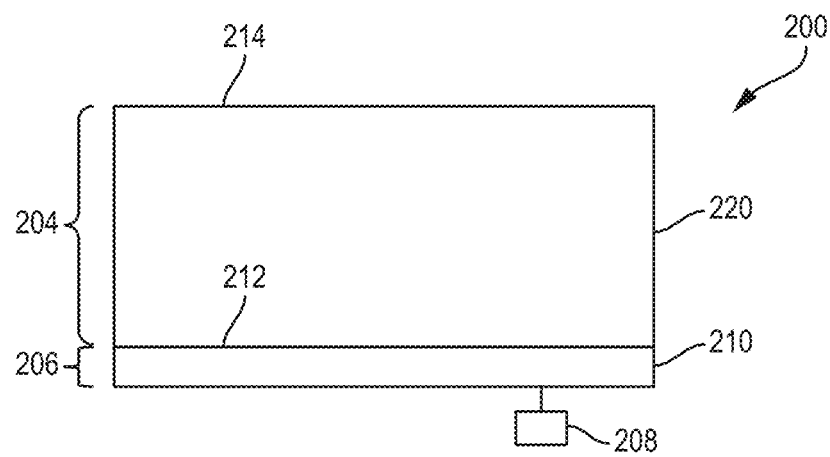
FIG. 2A depicts a semiconductor device after depositing an n-doped silicon material in accordance with at least some embodiments of the present disclosure.

FIG. 1 depicts a flow chart of a method 100 of processing a substrate in accordance with at least some embodiments of the present disclosure. At 102, the method 100 includes depositing, via a first epitaxial growth process, an n-doped silicon material onto a substrate (e.g., substrate 210) to form an n-doped layer (e.g., n-doped layer 220) while adjusting a ratio of dopant precursor to silicon precursor so that a dopant concentration of the n-doped layer increases from a bottom of the n-doped layer (e.g., bottom 212) to a top (e.g., top 214) of the n-doped layer. For example, FIG. 2A depicts a semiconductor device 200 comprising a substrate 210 after depositing an n-doped silicon material in accordance with at least some embodiments of the present disclosure. In some embodiments, the n-doped layer 220 is about 30 to about 50 micrometers thick. In some embodiments, the n-doped layer 220 comprises a doped silicon material, such as doped silicon or doped silicon carbide. The n-doped layer 220 may be doped with any suitable dopant, for example, phosphorus or arsenic.

In some embodiments, a thickness 204 of the n-doped layer 220 is about 30 to about 50 micrometers. In some embodiments, a thickness 206 the substrate 210 is about 0.5 to about 5 micrometers. In some embodiments, the substrate 210 comprises an n-doped material having positively charged ions (i.e., n$^+$-type semiconductor substrate) while the n-doped layer 220 comprises an n-doped material having negatively charged ions (i.e., n$^-$-type semiconductor substrate). In some embodiments, the substrate 210 comprises an n-doped material having negatively charged ions while the n-doped layer 220 comprises an n-doped material having positively charged ions. In some embodiments, the substrate 210 may be pre-cleaned prior to the first epitaxial growth process. The substrate 210 may be coupled to a drain region (e.g., drain) 208 of the semiconductor device 200. For example, the drain region is coupled to the substrate on a side opposite the n-doped layer.

At 104, the method 100 includes etching the n-doped layer to form a plurality of trenches (e.g., plurality of trenches 228) having sidewalls (e.g., sidewalls 230) that are tapered. In some embodiments, the method 100 includes depositing a mask, such as an oxide hardmask, over the n-doped layer 220. The mask may be used to pattern the plurality of trenches 228 prior to etching the n-doped layer 220 to form the plurality of trenches 228.

Figure 2B:
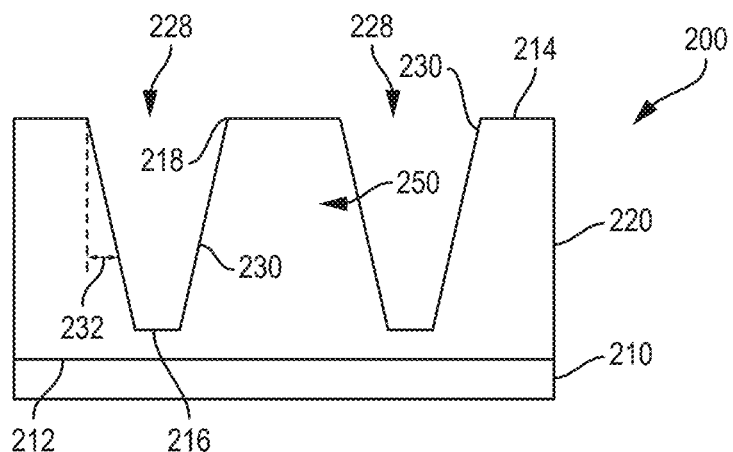
FIG. 2B depicts the semiconductor device of FIG. 2A with a plurality of trenches in accordance with at least some embodiments of the present disclosure.

FIG. 2B depicts the semiconductor device 200 of FIG. 2A after etching the plurality of trenches 228 in accordance with at least some embodiments of the present disclosure. The plurality of trenches 228 may be uniform in size and disposed along regular intervals. The plurality of trenches 228 generally include sidewalls 230 that taper downward and inward so that a top 218 of each of the plurality of trenches 228 is wider than a bottom 216 of each of the plurality of trenches 228. In some embodiments, the top 218 of each of the plurality of trenches 228 are disposed substantially along a common horizontal plane as the top 214 of the n-doped layer 220. The plurality of trenches 228 define a plurality of n-doped pillars 250 therebetween. In some embodiments, the plurality of trenches 228 are etched to a depth of about 30 to about 50 micrometers. In some embodiments, the plurality of trenches 228 have a bottom width of about 0.5 to about 1.5 micrometers and a top width of about 1.0 to about 2.0 micrometers. In some embodiments, the plurality of trenches 228 have an aspect ratio of 1:1 to about 1:40, or about 1:1 to about 1:20. In some embodiments, the sidewalls 230 taper at an angle 232 of about 1 to about 4 degrees from normal to the top 214 of the n-doped layer 220.

Figure 3:
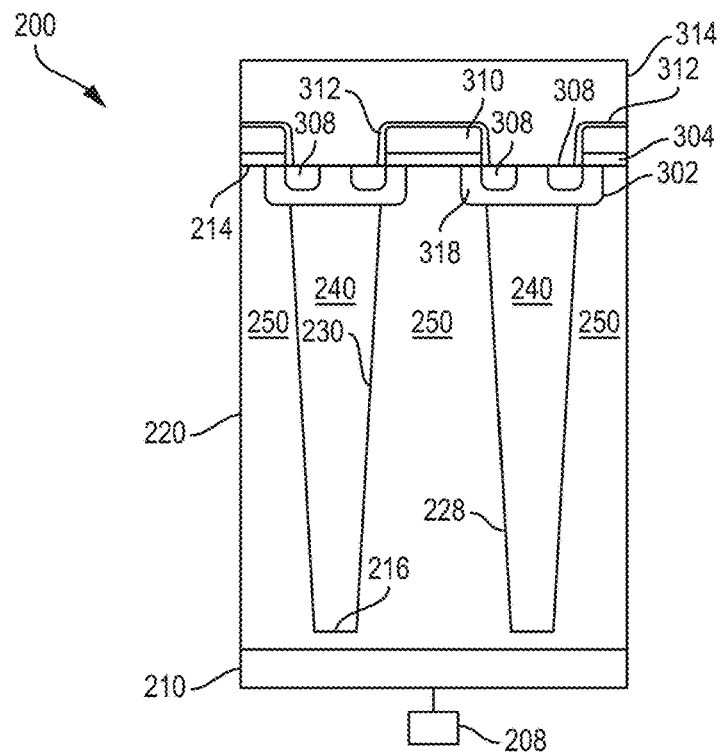
FIG. 3 depicts a cross-sectional view of a portion of a semiconductor device in accordance with at least some embodiments of the present disclosure.
Figure 4:
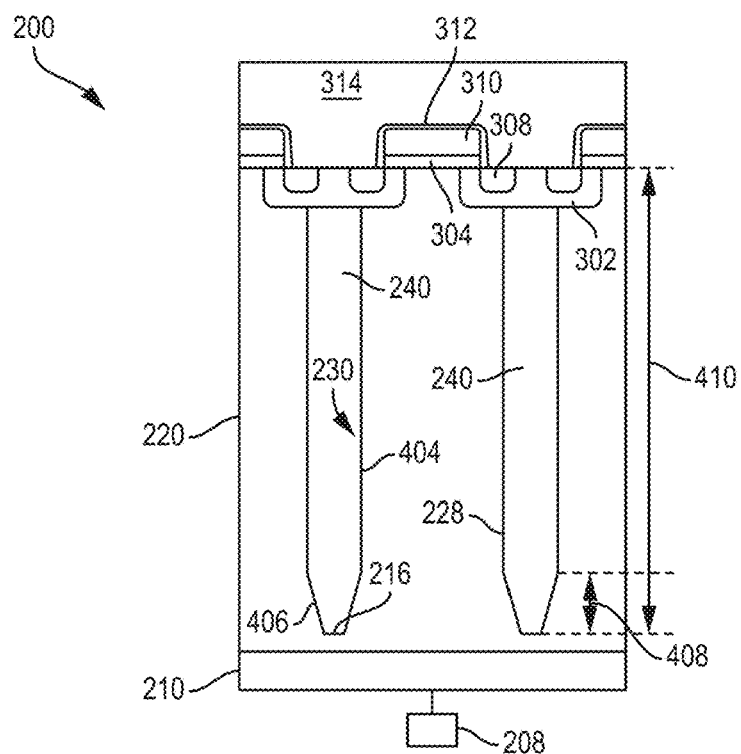
FIG. 4 depicts a cross-sectional view of a portion of a semiconductor device in accordance with at least some embodiments of the present disclosure.

FIG. 3 depicts a cross-sectional view of a portion of a semiconductor device 200 in accordance with at least some embodiments of the present disclosure. FIG. 4 depicts a cross-sectional view of a portion of a semiconductor device in accordance with at least some embodiments of the present disclosure. In some embodiments, as shown FIG. 3, sidewalls 230 of the plurality of trenches 228 taper continuously from the top 218 of the plurality of trenches 228 to the bottom 216 of the plurality of trenches. In some embodiments, etching the n-doped layer comprises forming a plurality of trenches, as shown in FIG. 4, having sidewalls 230 that include upper sidewalls 404 that are substantially vertical and lower sidewalls 406 that are tapered.

The sidewalls 230 are tapered inwards so that epitaxy deposition on the sidewalls 230 of the plurality of trenches 228 is less likely to form voids in the plurality of trenches 228 during the formation of the p-doped pillars 240. The inventors have observed that sidewalls 230 that are continuously tapered (such as in FIG. 3) or partially tapered (such as in FIG. 4) reduce or prevent void formation during the formation of the plurality of p-doped pillars 240. The inventors have also observed that sidewalls 230 that are partially tapered have wider plurality of n-doped pillars 250, which is advantageous in increasing breakdown voltage as current may go through the n-doped pillars 250 only. In some embodiments, the lower sidewalls 406 have a depth 408 that is about 1 to about 10 percent of a depth 410 of the plurality of trenches 228 of the sidewalls 230 that include upper sidewalls 404 that are substantially vertical and lower sidewalls 406 that are tapered.

In some embodiments, the dopant concentration of the n-doped layer 220 comprises a first dopant concentration at the bottom 212 of the n-doped layer 220 and a second dopant concentration at a top 214 of the n-doped layer 220. In some embodiments, the first dopant concentration at the bottom of the n-doped layer 220 is about 5e15 to about 8e15 per cubic centimeter. In some embodiments, the second dopant concentration at the top 214 of the n-doped layer 220 is about 1e16 to about 2e16 per cubic centimeter.

In some embodiments, the n-doped layer 220 is doped based on a calibration method. In some embodiments, the calibration method comprises tuning the n-doped layer 220 by defining the first dopant concentration and the second dopant concentration based on certain parameters, such as expected breakdown voltage or a shape and size of the plurality of trenches 228. The calibration method may include adjusting the dopant concentration in any suitable manner from the first dopant concentration to the second dopant concentration during the epitaxy deposition of the n-doped layer. For example, the dopant concentration may be adjusted linearly, parabolically, in a piecewise manner, or the like, from the first dopant concentration to the second dopant concentration.

Figure 2C:
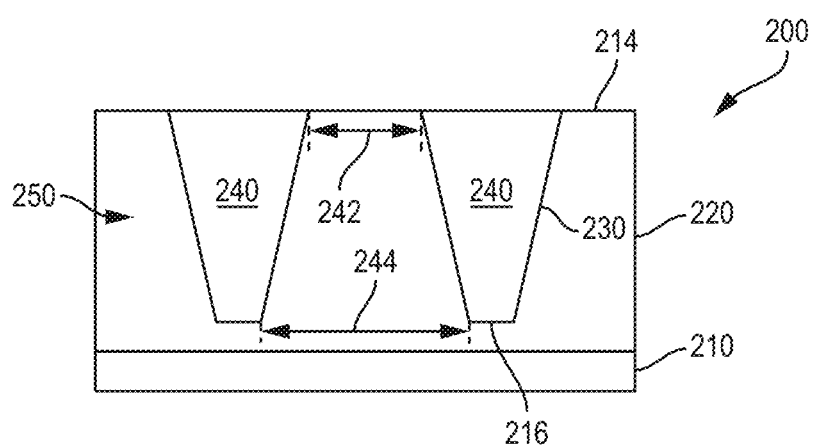
FIG. 2C depicts the semiconductor device of FIG. 2B with the plurality of trenches filled with p-doped material in accordance with at least some embodiments of the present disclosure.

Referring back to FIG. 1, at 106, the method 100 includes filling the plurality of trenches with a p-doped material via a second epitaxial growth process. For example, FIG. 2C depicts the semiconductor device 200 of FIG. 2B with the plurality of trenches 228 filled with p-doped material to form a plurality of p-doped pillars 240 in accordance with at least some embodiments of the present disclosure. The inventors have observed that tapered sidewalls advantageously reduce void formation in the plurality of trenches 228. However, sidewalls 230 that are tapered have a first width 242 between adjacent p-doped pillars 240 proximate the top 218 of the plurality of trenches 228 that is narrower than a second width 244 between adjacent p-doped pillars 240 proximate the bottom 216 of the plurality of trenches 228. The different widths cause a charge imbalance between the plurality of p-doped pillars 240 and plurality of n-doped pillars 250. In some embodiments, a planarization process, such as a chemical mechanical polishing (CMP) process may be performed at the top (e.g., top 214) of the n-doped layer 220 after forming the p-doped pillars 240.

The n-doped layer 220 having a doping gradient advantageously improves the charge imbalance due to the sidewalls 230 being tapered. For example, the n-doped layer 220 has a larger concentration of dopant at the first width 242, which is narrower, than at the second width 244, which is wider than the first width 242. In some embodiments, a dopant concentration of the p-doped pillars 240 is between the first dopant concentration and the second dopant concentration of the n-doped layer 220. In some embodiments, the plurality of p-doped pillars 240 have a substantially uniform dopant concentration. In some embodiments, the p-doped material comprises silicon or silicon carbide doped with any suitable p-type dopant, such as boron, aluminum, or gallium.

Referring back to FIGS. 3 and 4, the semiconductor device 200 may further include wells 308 that are n$^+$-doped disposed atop or embedded within a top of each of the plurality of p-doped pillars 240. In some embodiments, the n-doped layer 220 includes recesses 302 atop each of the plurality of p-doped pillars 240, where the recesses 302 are wider than the plurality of trenches 228. The recesses 302 are filled with a p-doped body 318. In some embodiments, the wells 308 are at least partially disposed in the p-doped body 318.

In some embodiments, the semiconductor device 200 includes a metal oxide layer 304 disposed on the plurality of n-doped pillars 250 of the n-doped layer 220 and partially over adjacent ones of the p-doped body 318 or partially over adjacent ones of the plurality of p-doped pillars 240. In some embodiments, a gate electrode 310 is disposed on the metal oxide layer. The gate electrode may be made of polysilicon, a silicide material, or metal composites such as tungsten nitride (WN), titanium nitride (TiN), tantalum nitride (TaN), or the like. An insulating film 312 comprising at least one of a nitride layer or oxide layer may be disposed on an upper surface and sides of the gate electrode 310 to encapsulate the gate electrode 310. A source electrode 314 may be disposed on the insulating film 312 and the plurality of p-doped pillars 240. The source electrode 314 may also be disposed on and coupled to the wells 308. The source electrode 314 may, for example, be an aluminum-based electrode.

In use, when a positive voltage is applied to the drain, a depletion region is formed between the plurality of n-doped pillars 250 and the plurality of p-doped pillars 240. When a gate voltage is applied to the semiconductor device 200 higher than a threshold voltage, an inversion layer forms between the metal oxide layer 304 and the n-doped layer 220. The inversion layer facilitates a flow of current from the drain 208 to the source electrode 314. In some embodiments, current flows from the drain 208 to the source electrode 314 via the n-doped layer 220 and the wells 308.

Figure 5:
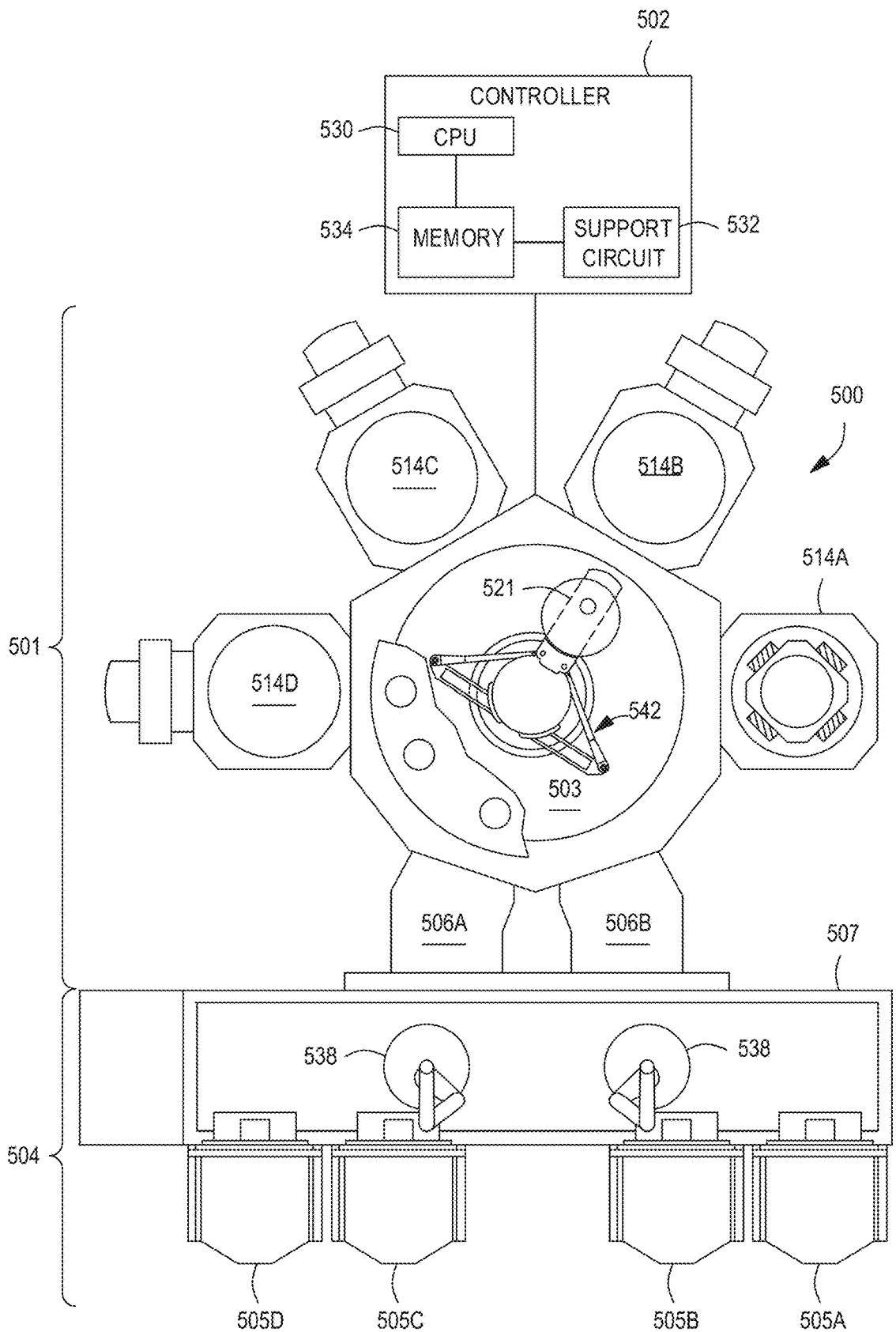
FIG. 5 depicts a schematic side view of an epitaxy chamber in accordance with at least some embodiments of the present disclosure.

FIG. 5 depicts a schematic view of a multi-chamber processing tool 500 suitable to perform methods for processing a substrate in accordance with at least some embodiments of the present disclosure. Examples of the multi-chamber processing tool 500 may include the CENTURA® and ENDURA® tools, commercially available from Applied Materials, Inc., of Santa Clara, California. The methods described herein may be practiced using other multi-chamber processing tools having suitable process chambers coupled thereto, or in other suitable standalone process chambers. For example, in some embodiments, the inventive methods discussed above may be advantageously performed in a multi-chamber processing tool such that there are limited or no vacuum breaks between processing steps. For example, reduced vacuum breaks may limit or prevent contamination of any substrates being processed in the multi-chamber processing tool. Other process chambers, including ones available from other manufacturers, may also be suitably used in connection with the teachings provided herein.

The multi-chamber processing tool 500 includes a processing platform 501 that is vacuum-tight, a factory interface (FI) 504, and a system controller 502. The processing platform 501 includes multiple processing chambers, such as 514A, 514B, 514C, and 514D, operatively coupled to a transfer chamber 503 that is under vacuum. The factory interface 504 is selectively operatively coupled to the transfer chamber 503 by one or more load lock chambers, such as 506A and 506B shown in FIG. 5.

In some embodiments, the factory interface 504 comprises at least one docking station 507 and at least one factory interface robot 538 to facilitate the transfer of the substrates. The at least one docking station 507 is configured to accept one or more front opening unified pod (FOUP). Four FOUPS, identified as 505A, 505B, 505C, and 505D, are shown in FIG. 5. The at least one factory interface robot 538 is configured to transfer the substrates from the factory interface 504 to the processing platform 501 through the load lock chambers 506A, 506B. Each of the load lock chambers 506A and 506B have a first port coupled to the factory interface 504 and a second port coupled to the transfer chamber 503. The load lock chambers 506A and 506B are coupled to a pressure control system (not shown) which pumps down and vents the load lock chambers 506A and 506B to facilitate passing the substrates between the vacuum environment of the transfer chamber 503 and the substantially ambient (e.g., atmospheric) environment of the factory interface 504.

The transfer chamber 503 has a vacuum robot 542 disposed therein. The vacuum robot 542 is capable of transferring a substrate 521 between the load lock chamber 506A and 506B and the processing chambers 514A, 514B, 514C, and 514D. In some embodiments, the substrate 521 may be substrate 210. In some embodiments, the vacuum robot 542 can extend into and retract from any processing chambers coupled to the transfer chamber 203.

Each of the processing chambers 514A, 514B, 514C, and 514D may comprise an epitaxy chamber, a chemical vapor deposition (CVD) chamber, an atomic layer deposition (ALD) chamber, a physical vapor deposition (PVD) chamber, a plasma enhanced atomic layer deposition (PEALD) chamber, an etch chamber (i.e., dry etch chamber), a pre-clean/annealing chamber, a masking chamber, or the like. In some embodiments, at least one of the processing chambers 514A, 514B, 514C, and 514D is an epitaxy chamber configured to perform at least one of the first epitaxy process or the second epitaxy process.

The system controller 502 controls the operation of the multi-chamber processing tool 500 using a direct control of the at least one epitaxy chamber or alternatively, by controlling the computers (or controllers) associated with the epitaxy chamber and the process chambers 514A, 514B, 514C, and 514D. The system controller 502 generally includes a central processing unit (CPU) 530, a memory 534, and a support circuit 532. The CPU 530 may be one of any form of a general-purpose computer having one or more processors that can be used in an industrial setting. The support circuit 532 is conventionally coupled to the CPU 130 and may comprise a cache, clock circuits, input/output subsystems, power supplies, and the like. Software routines, such as processing methods as described above may be stored in the memory 534 and, when executed by the CPU 530, transform the CPU 530 into a system controller 502. The software routines may also be stored and/or executed by a second controller (not shown) that is located remotely from the multi-chamber processing tool 500.

In operation, the system controller 502 enables data collection and feedback from the respective chambers and systems to optimize performance of the multi-chamber processing tool 500 and provides instructions to system components to perform the methods described herein. For example, the memory 534 can be a non-transitory computer readable storage medium having instructions that when executed by the CPU 530 (or system controller 502) perform the methods described herein.

Returning back to FIG. 1, in some embodiments, at 108, the method 100 further comprises forming gate and source regions of the semiconductor device 200 atop the plurality of n-doped pillars 250 and the plurality of p-doped pillars 240. For example, in some embodiments, the top 214 of the n-doped layer 220 may be etched to form recesses (e.g., recesses 302) so that a plurality of p-doped bodies (e.g., p-doped bodies 318) may be deposited therein and coupled to a source electrode (e.g., source electrode 314) formed thereafter. Each of the p-doped bodies 318 may extend vertically below a gate oxide (e.g., metal oxide layer 304) and gate electrode (e.g., gate electrode 310) formed thereafter. For example, the gate oxide is deposited on each n-doped pillar 250 of the n-doped layer 220 and partially over the plurality of p-doped pillars 240 after forming the p-doped pillars 240.

In some embodiments, the method 100 further comprises depositing a gate electrode on the metal oxide layer. An insulating film (e.g., insulating film 312) comprising at least one of a nitride layer or oxide layer may be deposited on the gate electrode 310. The source electrode 314 may be deposited on the insulating film 312 and the plurality of p-doped pillars 240, where the insulating film insulates the gate electrode from the source electrode. The source electrode 314 is electrically coupled to the wells 308, and in some embodiments, the p-doped body 318. The source electrode 314 shorts the p-doped body 318 with the plurality of p-doped pillars 240 to prevent latch up or forming of a parasitic diode structure.

While the foregoing is directed to embodiments of the present disclosure, other and further embodiments of the disclosure may be devised without departing from the basic scope thereof.

The invention claimed is:

1. A method of processing a substrate, comprising:
depositing, via a first epitaxial growth process, an n-doped silicon material onto a substrate to form an n-doped layer while adjusting a ratio of dopant precursor to silicon precursor so that a dopant concentration of the n-doped layer increases from a bottom of the n-doped layer to a top of the n-doped layer;
etching the n-doped layer to form a plurality of trenches having sidewalls that are tapered and a plurality of n-doped pillars therebetween; and
filling the plurality of trenches with a p-doped material via a second epitaxial growth process to form a plurality of p-doped pillars, wherein at least one of:
the etching the n-doped layer further comprises etching a recess atop each of the plurality of trenches, wherein the recess is wider than the plurality of trenches, or
further comprising forming wells that are n-doped disposed atop or embedded within a top of each of the plurality of p-doped pillars.

2. The method of claim 1, further comprising:
forming gate and source regions atop the plurality of n-doped pillars and the plurality of p-doped pillars, wherein a drain region is coupled to the substrate on a side opposite the n-doped layer.

3. The method of claim 1, wherein at least one of:
the n-doped layer is doped with phosphorus or arsenic, or
the p-doped material comprises silicon or silicon carbide doped with boron, aluminum, or gallium.

4. The method of claim 1, wherein etching the n-doped layer comprises etching only partially through the n-doped layer so that a portion of the n-doped layer is disposed between the plurality of trenches and the substrate.

5. The method of claim 1, wherein the dopant concentration comprises a first dopant concentration at the bottom of the n-doped layer of about 5e15 to about 8e15 per cubic centimeter and a second dopant concentration at the top of the n-doped layer of about 1e16 to about 2e16 per cubic centimeter.

6. The method of claim 1, wherein etching the n-doped layer comprises forming a plurality of trenches having upper sidewalls that are substantially vertical and lower sidewalls that are linearly tapered.

7. The method of claim 1, wherein the plurality of p-doped pillars have a bottom width of about 0.5 to about 1.5 micrometers and a top width of about 1.0 to about 2.0 micrometers.

8. A non-transitory computer readable medium, that when executed via one or more processors, performs a method of processing a substrate, comprising:
depositing, via a first epitaxial growth process, an n-doped silicon material onto a substrate to form an n-doped layer while adjusting a ratio of dopant precursor to silicon precursor so that a dopant concentration of the n-doped layer increases from a bottom of the n-doped layer to a top of the n-doped layer;
etching the n-doped layer to form a plurality of trenches having sidewalls that are tapered and a plurality of n-doped pillars therebetween; and
filling the plurality of trenches with a p-doped material via a second epitaxial growth process to form a plurality of p-doped pillars, wherein at least one of:
the etching the n-doped layer further comprises etching a recess atop each of the plurality of trenches, wherein the recess is wider than the plurality of trenches, or further comprising forming wells that are n-doped disposed atop or embedded within a top of each of the plurality of p-doped pillars.

9. The non-transitory computer readable medium of claim 8, wherein the dopant concentration comprises a first dopant concentration at the bottom of the n-doped layer of about 5e15 to about 8e15 per cubic centimeter and a second dopant concentration at the top of the n-doped layer of about 1e16 to about 2e16 per cubic centimeter.

10. The non-transitory computer readable medium of claim 8, wherein etching the n-doped layer comprises forming a plurality of trenches having upper sidewalls that are substantially vertical and lower sidewalls that are linearly tapered.

11. The non-transitory computer readable medium of claim 8, further comprising depositing an oxide hardmask over the n-doped layer prior to etching the n-doped layer to form the plurality of trenches.

12. The non-transitory computer readable medium of claim 8, wherein the plurality of p-doped pillars have a bottom width of about 0.5 to about 1.5 micrometers and a top width of about 1.0 to about 2.0 micrometers.

* * * * *